US010326317B2

(12) United States Patent
Krupezevic et al.

(10) Patent No.: US 10,326,317 B2
(45) Date of Patent: Jun. 18, 2019

(54) METHOD FOR FOREIGN OBJECT DETECTION FOR AN INDUCTION CHARGING DEVICE AND INDUCTION CHARGING DEVICE

(71) Applicant: Robert Bosch GmbH, Stuttgart (DE)

(72) Inventors: Dragan Krupezevic, Stuttgart (DE); Martin Gonda, Bühl (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/516,246

(22) PCT Filed: Aug. 26, 2015

(86) PCT No.: PCT/EP2015/069533
§ 371 (c)(1),
(2) Date: Mar. 31, 2017

(87) PCT Pub. No.: WO2016/050424
PCT Pub. Date: Apr. 7, 2016

(65) Prior Publication Data
US 2017/0302111 A1   Oct. 19, 2017

(30) Foreign Application Priority Data
Oct. 1, 2014   (DE) .................. 10 2014 219 964

(51) Int. Cl.
*H02M 1/00* (2006.01)
*H02J 50/60* (2016.01)
(Continued)

(52) U.S. Cl.
CPC .............. *H02J 50/60* (2016.02); *G01V 3/101* (2013.01); *H02J 7/025* (2013.01); *H02J 50/10* (2016.02);
(Continued)

(58) Field of Classification Search
CPC ............ H02M 1/00; H04W 4/00; H01L 21/00; H01L 2221/00
See application file for complete search history.

(56) References Cited

U.S. PATENT DOCUMENTS

2009/0030302 A1* 1/2009 Taniguchi ............ A61B 6/5241
                                                        600/410
2013/0063160 A1   3/2013 Nakano et al.
(Continued)

FOREIGN PATENT DOCUMENTS

CN      101335468 A    12/2008
CN      102714893 A    10/2012
(Continued)

OTHER PUBLICATIONS

International Search Report for PCT/EP2015/069533, dated Jan. 8, 2016.

*Primary Examiner* — Jermele M Hollington
*Assistant Examiner* — Temilade S Rhodes-Vivour
(74) *Attorney, Agent, or Firm* — Norton Rose Fulbright US LLP; Gerard Messina

(57) ABSTRACT

A method for foreign object detection for an induction charging device is described, including an oscillator circuit, in particular, for a hand-held power tool, a resonance frequency and an associated actual quality of the oscillator circuit being detected and the actual quality is subsequently compared to a setpoint quality as a function of the resonance frequency and a decision is made about the presence of a foreign object based on a defined setpoint quality range. The method provides that an upper limit and/or a lower limit of the setpoint quality range and the profile of the actual quality are adapted to one another. Also described is an induction charging device including an oscillator circuit and a control and regulating unit for carrying out the method.

8 Claims, 3 Drawing Sheets

(51) Int. Cl.
*G01V 3/10* (2006.01)
*H02J 7/02* (2016.01)
*H02J 50/10* (2016.01)
*H01L 21/00* (2006.01)
*H04W 4/00* (2018.01)

(52) U.S. Cl.
CPC .......... *H01L 21/00* (2013.01); *H01L 2221/00* (2013.01); *H02M 1/00* (2013.01); *H04W 4/00* (2013.01)

(56) References Cited

U.S. PATENT DOCUMENTS

| | | | | |
|---|---|---|---|---|
| 2013/0093389 A1* | 4/2013 | Partovi | ................ | H01F 7/0252 320/108 |
| 2013/0285604 A1* | 10/2013 | Partovi | ................ | H02J 7/0042 320/108 |
| 2014/0015329 A1* | 1/2014 | Widmer | ............... | G01D 5/2006 307/104 |
| 2014/0021908 A1* | 1/2014 | McCool | ................ | B60L 11/182 320/108 |
| 2014/0021912 A1* | 1/2014 | Martin | .................. | B60L 11/182 320/109 |
| 2014/0180612 A1 | 6/2014 | Rejman et al. | | |
| 2014/0191568 A1* | 7/2014 | Partovi | ................... | H02J 7/025 307/9.1 |
| 2015/0109000 A1* | 4/2015 | Sieber | .................... | G01B 7/003 324/655 |
| 2015/0123602 A1* | 5/2015 | Patino | .................... | H02J 7/025 320/108 |

FOREIGN PATENT DOCUMENTS

| | | |
|---|---|---|
| CN | 102823101 A | 12/2012 |
| CN | 103069689 A | 4/2013 |
| CN | 103180758 A | 6/2013 |
| DE | 102012112953 A1 | 6/2014 |
| DE | 102013212588 A1 | 12/2014 |
| JP | 2013027255 A | 2/2013 |

* cited by examiner

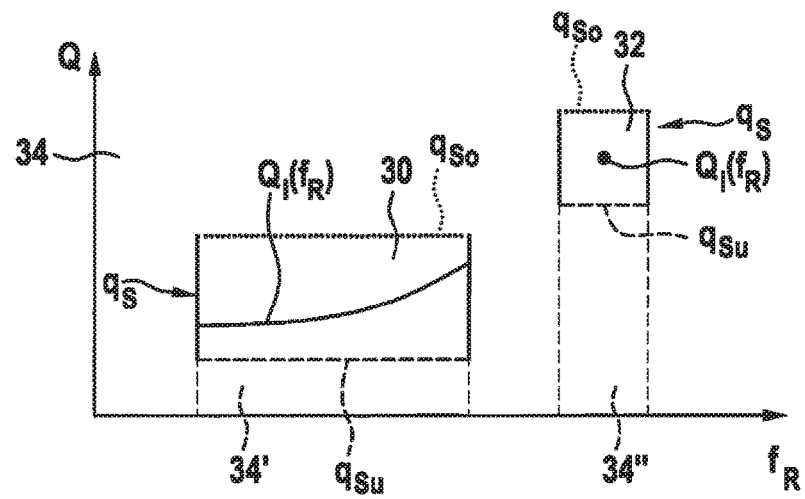
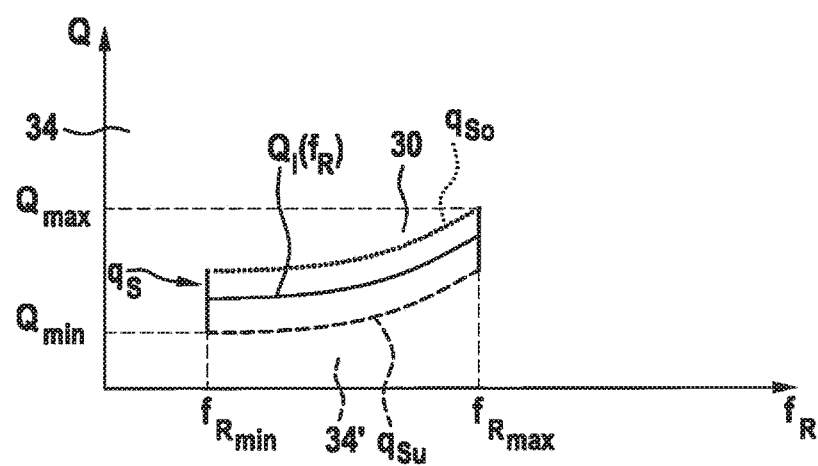

METHOD FOR FOREIGN OBJECT DETECTION FOR AN INDUCTION CHARGING DEVICE AND INDUCTION CHARGING DEVICE

FIELD OF THE INVENTION

The present invention relates to a method for foreign object detection for an induction charging device and an induction charging device.

BACKGROUND INFORMATION

It is known to wirelessly charge rechargeable battery-operated hand-held devices such as toothbrushes, mobile communication devices, electrically operated hand-held power tools or the like. For this purpose, an electromagnetic field is used for inductive energy transmission from an induction charging device to a rechargeable battery device of the hand-held device, the induction charging device and the rechargeable battery device each including a coil, which are positionable at a small distance from one another and thus together essentially form a transformer.

If an electrically conductive foreign object enters into the area of the electromagnetic field, eddy currents may form, which heat the foreign object. The foreign object, if it is magnetizable, may also be heated as a result of remagnetization losses or hysteresis losses. The heating may be substantial, so that an operational reliability of the inductive charging system is no longer ensurable. In addition, the foreign object may withdraw energy from the electromagnetic field, so that the energy transmission to the rechargeable battery device is disrupted.

An inductive charging system is known from German Published Patent Application No. 10 2012 205 693 A1, including an induction charging device for wirelessly transmitting energy to a rechargeable battery device, a resonance transformer of the induction charging device generating an alternating electromagnetic field with a charge coil. A determination unit is provided for detecting an object in the area of the charge coil as a function of an electrical parameter at the resonance transformer. In addition, the induction charging device includes a control and regulating unit for changing a quality factor of the resonance transformer, in order to permit an energy transmission in the case of a low quality factor and a detection of the object in the case of a high quality factor.

Furthermore, a method for foreign object detection for an induction charging device is known from unpublished German Published Patent Application No. 10 2013 212 588, in which a resonance frequency and an associated actual quality of an oscillator circuit of the induction charging device are detected and the actual quality is subsequently compared to a setpoint quality as a function of the resonance frequency. Based on a defined setpoint quality range, a decision is then made about the presence of a foreign object.

SUMMARY

An object of the present invention is to further improve the methods known from the related art for foreign object detection for an induction charging device as well as the corresponding induction charging devices, and to increase the detection accuracy of foreign objects.

Advantages of the Invention

According to the present invention, it is provided that the method for foreign object detection for an induction charging device adapts an upper limit and/or a lower limit of the setpoint quality range and the profile of the actual quality to one another. In this way, the setpoint quality range, within which an error-free charging operation of the inductive charging system is ensured, may be reduced, which results in an increased precision and sensitivity of the detection of errors caused by foreign objects.

In one advantageous embodiment, it is provided to change the upper limit and/or the lower limit of the setpoint quality range within a maximum setpoint quality and a minimum setpoint quality in such a way that its profile largely corresponds to the profile of the actual quality. In this way, the effective setpoint quality range is reduced, with the gap between the actual quality and the upper limit and the lower limit of the effective setpoint quality range remaining essentially the same. As a result, the accuracy of the foreign object detection may be increased with greater values for the resonance frequency and for the actual quality, i.e., close to the maximum permissible resonance frequency, in particular, in the case of a more radical mispositioning of the rechargeable battery device relative to at least one charge coil of the induction device.

In one alternative embodiment, it is provided that the actual quality is corrected with a correction factor in such a way that its profile is linear and constant. The correction factor is defined, for example, as the inverse of the actual quality. It may, however, be stored as a fixed correction profile in a memory of the induction charging device. The maximum setpoint quality of the setpoint quality range may be advantageously decreased and the minimum setpoint quality of the setpoint quality range may be increased with the gap between the actual quality and the upper limit and the lower limit remaining essentially the same, which results in a reduction of the setpoint quality range. In addition, it is further provided that the upper limit and/or the lower limit of the setpoint quality range are also multiplied by the correction factor, as a result of which an essentially rectangular area of the setpoint quality range is obtained. Thus, a very simple comparison for foreign object detection and a uniform accuracy of the foreign object detection is possible regardless of the resonance frequency.

The present invention also relates to an induction charging device including an oscillator circuit and a control and regulating unit, in particular, for a hand-held power tool, for carrying out the method for foreign object detection according to the present invention, the control and regulating unit adapting the upper limit and/or the lower limit of the setpoint quality range and the profile of the actual quality to one another.

BRIEF DESCRIPTION OF THE DRAWINGS

FIG. 2 shows a relation table of a control and regulating unit of the induction charging device according to the related art in the form of a schematic diagram.

FIG. 3 shows a first exemplary embodiment of a relation table of the control and regulating unit of the induction charging device according to the present invention in a schematic diagram.

DETAILED DESCRIPTION

Figure 1:
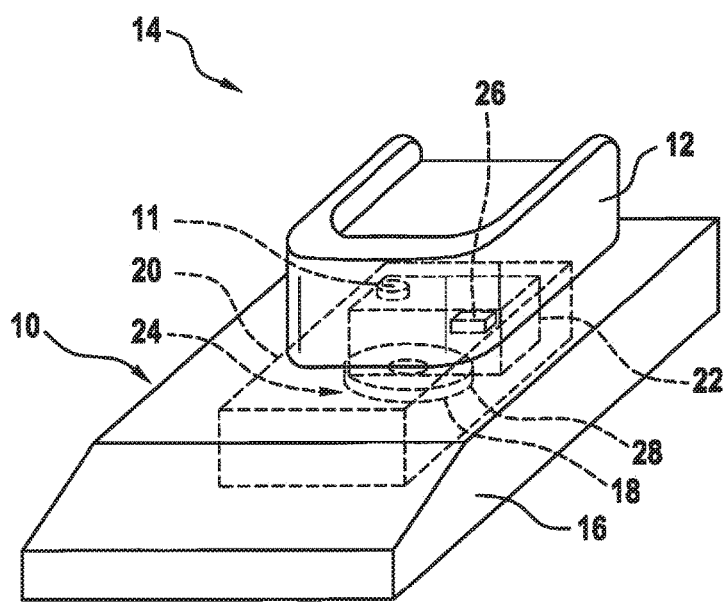
FIG. 1 shows an induction charging device for carrying out the method according to the present invention for foreign object detection and a rechargeable battery device to be charged in a schematic representation.

FIG. 1 shows an induction charging device 10 for carrying out the method according to the present invention for detecting a foreign object 11. FIG. 1 also shows a rechargeable battery device 12 to be charged for a hand-held power tool not shown. Induction charging device 10 forms the primary side of a charging system 14 and is provided to charge rechargeable battery device 12, which is designed as a hand-held power tool rechargeable battery or a hand-held power tool with integrated rechargeable battery. In principle, however, it would also be conceivable to charge other rechargeable battery devices that would be meaningful to those skilled in the art with induction charging device 10.

FIG. 1 shows induction charging device 10 and rechargeable battery device 12 to be charged in a charging operation. Rechargeable battery device 12 in this operation is placed on top of a housing 16 of induction charging device 10 and is wirelessly charged via at least one charge coil 18 of induction charging device 10. Induction charging device 10 includes a charging electronics unit 20, which in turn includes a control and regulating unit 22, as well as an oscillator circuit 24 having the at least one charge coil 18.

Control and regulating unit 22 of induction charging device 10 is provided to determine a resonance frequency $f_R$ and an associated actual quality $Q_I(f_R)$. In addition, control and regulating unit 22 is provided to compare the actual quality $Q_I(f_R)$ to a setpoint quality $Q_s(f_R)$ as a function of resonance frequency $f_R$. For this purpose, control and regulating unit 22 includes a memory 26, in which a relation table is stored, which contains a setpoint quality range $q_s$ having multiple setpoint qualities $Q_s(f_R)$ for the ascertained resonance frequency $f_R$ (cf. in this regard also the following explanations with respect to FIG. 2).

During a charging operation of induction charging device 10, a foreign object detection is carried out at regular intervals. During the foreign object detection, it is checked whether one or multiple foreign objects 11, which could impair a charging operation, are situated between induction charging device 10 and rechargeable battery device 12 or are simply on top of induction charging device 10 and/or put an operator or induction charging device 10 at risk. The foreign object detection takes place in accordance with a method described in the unpublished German application DE 10 2013 212 588 in such a way that resonance frequency $f_R$ and associated actual quality $Q_I(f_R)$ are initially determined. Actual quality $Q_I(f_R)$ is then compared to setpoint quality $Q_s(f_R)$ as a function of resonance frequency $f_R$ in order to ultimately make a decision based on the defined setpoint quality range $q_s$ whether at least one foreign object 11 is present or not.

FIG. 2 shows the relation table of control and regulating unit 22 stored in memory 26 in the form of a schematic diagram, in which resonance frequency $f_R$ is plotted on the x-axis and quality Q is plotted on the y-axis. The diagram is divided into three ranges 30, 32, 34. A first range 30 is formed by a setpoint quality range $q_s$ for an operation with rechargeable battery device 12. If actual quality $Q_I(f_R)$ is within an upper limit $q_{so}$ and a lower limit $q_{su}$ of range 30, it is assumed that no foreign object 11 is located in an area between induction charging device 10 and rechargeable battery device 12. It is further assumed that rechargeable battery device 12 rests on induction charging device 10 and is to be charged. A second range 32 is formed by a setpoint quality range $q_s$ for an operation without rechargeable battery device 12. If actual quality $Q_I(f_R)$ lies within upper limit $q_{so}$ and lower limit $q_{su}$ of range 32, it is assumed that no foreign object 11 is located on induction charging device 10. It is further assumed that no rechargeable battery device 12 is situated on top of induction charging device 10.

A third range 34, which encloses first range 30 and second range 32 is formed by an error range. If actual quality $Q_I(f_R)$ is in this range 34, it is assumed that an arbitrary error is present or rechargeable battery device 12 is so poorly positioned relative to induction charging device 10 that a charging of rechargeable battery device 12 is not possible or possible only to a very limited extent. The error in this case may be located in induction charging device 10, in rechargeable battery device 12 as well as in the surroundings of charging system 14. Third range 34 includes two sub-ranges 34', 34". First sub-range 34' of third range 34 is situated below lower limit $q_{su}$ of first range 30 in relation to quality Q. If actual quality $Q_I(f_R)$ is within this first sub-range 34', it is assumed that at least one foreign object 11 is located in an area between induction charging device 10 and rechargeable battery device 12. Second sub-range 34" of third range 34 is situated below lower limit $q_{su}$ of second range 32 as related to quality Q. If actual quality $Q_I(f_R)$ is within this second sub-range 34", it is assumed that at least one foreign object 11 is situated on top of induction charging device 10.

For the profile of the actual quality $Q_I(f_R)$, the following non-linear correlation apparent in FIG. 2 applies, which hampers a reliable foreign object detection within setpoint quality range $q_s$. If the spacing between rechargeable battery device 12 and induction device 10 increases, then so too does resonance frequency $f_R$ as well as actual quality $Q_I(f_R)$. The same may be observed if rechargeable battery device 12 is shifted or positioned beyond its optimal position—the center of the at least one charge coil 18, regardless of the direction on the surface of induction device 10. These two cases describe very commonly occurring scenarios. Thus, allowance for a lateral offsetting of rechargeable battery device 12 on induction device 10 must be made, since a user generally will not set rechargeable battery device 12 precisely centered over the at least one charge coil 18 of induction device 10. This is the case, in particular, if induction device 10 has a flat surface with no mechanical guiding aids for rechargeable battery device 12. A vertical offsetting due to foreign objects 11 between rechargeable battery device 12 and induction device 10 is also possible.

According to the present invention, it is now provided to adapt upper limit $q_{so}$ and/or lower limit $q_{su}$ of setpoint quality range $q_s$ and the profile of actual quality $Q_I(f_R)$ to one another. The following FIGS. 3 and 4 show this for first range 30.

In FIG. 3, upper limit $q_{so}$ and lower limit $q_{su}$ of setpoint quality range $q_s$ are changed within a maximum setpoint quality $Q_{smax}$ and a minimum setpoint quality $Q_{smin}$ in such a way that their profile corresponds as far as possible to the profile of actual quality $Q_I(f_R)$. As a result, effective setpoint quality range $q_s$, within which an error-free charging operation is allowed, is reduced, with the gap between actual quality $Q_I(f_R)$ and upper or lower limit $q_{so}$, $q_{su}$ remaining essentially the same. As a result, the accuracy of the foreign object detection increases with greater values for resonance frequency $f_R$ and for actual quality $Q_I(f_R)$, i.e., close to maximum permissible resonance frequency $f_{Rmax}$, in particular, in the case of a more radical mispositioning of rechargeable battery device 12 relative to the at least one charge coil 18 of induction device 10.

Figure 4:
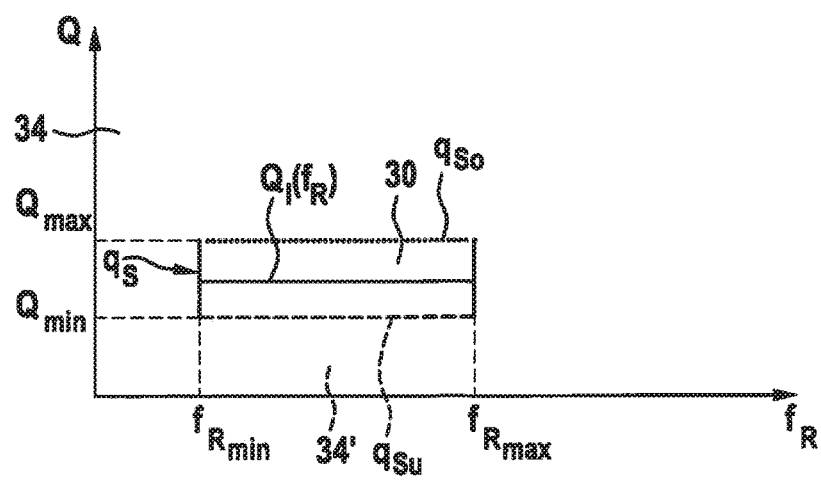
FIG. 4 shows a second exemplary embodiment of the relation table of the control and regulating unit of the induction charging device according to the present invention in a schematic diagram.

In FIG. 4 as well, effective setpoint quality range $q_s$ is significantly reduced compared to FIG. 3. In contrast to FIG. 3, however, actual quality $Q_I(f_R)$ is now corrected in such a way that its profile is linear and/or constant, so that maximum setpoint quality $Q_{smax}$, may be reduced and minimal setpoint quality $Q_{smin}$ may be increased with the gap between actual quality $Q_f(f_R)$ and the upper and lower limit $q_{so}$, $q_{su}$ remaining essentially the same. The linearization of actual quality $Q_f(f_R)$ is accomplished by multiplying it with its inverse $K=Q_0/Q_f(f_R)$ or with a corresponding correction factor K previously stored in memory 26, $Q_0$ describing a previously defined reference quality. Due to the linearization of $Q_f(f_R)$, an essentially rectangular area of setpoint quality range $q_s$ is obtained, which enables a very simple comparison for foreign object detection. In addition, this adaptation effectuates a uniform accuracy of the foreign object detection, regardless of resonance frequency $f_R$. Alternatively or in addition, upper limit and/or lower limit $q_{so}$, $q_{su}$ of setpoint quality range $q_s$ may also be multiplied by correction factor K in order to linearize its/their profile.

Lastly, it should be noted that the exemplary embodiments of the present invention shown are limited neither to the curve profiles shown in the figures nor to the design of the inductive charging system according to FIG. 1.

What is claimed is:

1. A method for foreign object detection for an induction charging device including an oscillator circuit, the method comprising:
   detecting a resonance frequency and an associated actual quality of the oscillator circuit;
   subsequently comparing the actual quality to a setpoint quality as a function of the resonance frequency;
   determining whether a foreign object is present based on a defined setpoint quality range; and
   adapting at least one of an upper limit and a lower limit of the setpoint quality range and a profile of the actual quality to one another.

2. The method for foreign object detection as recited in claim 1, wherein the induction charging device is for a hand-held power tool.

3. The method for foreign object detection as recited in claim 1, further comprising:
   changing the at least one of the upper limit and the lower limit of the setpoint quality range within a maximum setpoint quality and a minimum setpoint quality in such a way that a profile of the at least one of the upper limit and the lower limit of the setpoint quality range largely corresponds to the profile of the actual quality.

4. The method for foreign object detection as recited in claim 1, further comprising:
   correcting the actual quality by a correction factor in such a way that the profile is at least one of linear and constant.

5. The method for foreign object detection as recited in claim 4, wherein a distance of the at least one of the upper limit and the lower limit of the setpoint quality range is maintained essentially the same with respect to the profile of the corrected actual quality.

6. A method for foreign object for an induction charging device including an oscillator circuit, the method comprising:
   detecting a resonance frequency and an associated actual quality of the oscillator circuit;
   subsequently comparing the actual quality to a setpoint quality as a function of the resonance frequency;
   determining whether a foreign object is present based on a defined setpoint quality range;
   adapting at least one of an upper limit and a lower limit of the setpoint quality range and a profile of the actual quality to one another;
   correcting the actual quality by a correction factor in such a way that the profile is at least one of linear and constant; and
   multiplying the at least one of the upper limit and the lower limit of the setpoint quality range by the correction factor.

7. The method for foreign object detection as recited in claim 6, wherein the correction factor is defined as an inverse of the actual quality.

8. An induction charging device, comprising:
   an oscillator circuit; and
   a control and regulating unit, wherein the control and regulating unit:
      detects a resonance frequency and an associated actual quality of the oscillator circuit,
      subsequently compares the actual quality to a setpoint quality as a function of the resonance frequency,
      determines whether a foreign object is present based on a defined setpoint quality range, and
      adapts at least one of an upper limit and a lower limit of the setpoint quality range and a profile of the actual quality to one another.

\* \* \* \* \*